United States Patent
Drolet et al.

(10) Patent No.: US 10,748,969 B2
(45) Date of Patent: *Aug. 18, 2020

(54) DISPLAY WITH HOLOGRAPHIC ANGLE-OF-VIEW ADJUSTMENT STRUCTURES

(71) Applicant: Apple Inc., Cupertino, CA (US)

(72) Inventors: Jean-Jacques P. Drolet, San Jose, CA (US); Jonathan S. Steckel, Saratoga, CA (US)

(73) Assignee: Apple Inc., Cupertino, CA (US)

( * ) Notice: Subject to any disclaimer, the term of this patent is extended or adjusted under 35 U.S.C. 154(b) by 152 days.

This patent is subject to a terminal disclaimer.

(21) Appl. No.: 15/809,891

(22) Filed: Nov. 10, 2017

(65) Prior Publication Data

US 2018/0321432 A1     Nov. 8, 2018

Related U.S. Application Data

(60) Provisional application No. 62/501,582, filed on May 4, 2017.

(51) Int. Cl.
*H01L 27/32*      (2006.01)
*H01L 51/52*      (2006.01)
(Continued)

(52) U.S. Cl.
CPC ............ *H01L 27/3211* (2013.01); *G02B 5/32* (2013.01); *G02F 1/133504* (2013.01);
(Continued)

(58) Field of Classification Search
CPC ............ H01L 27/3211; H01L 27/3246; H01L 27/3234; H01L 51/5262; H01L 51/5265;
(Continued)

(56) References Cited

U.S. PATENT DOCUMENTS 5,224,198 A * 6/1993 Jachimowicz ......... G02B 6/003
                                                                         359/13
5,455,693 A * 10/1995 Wreede ..................... G02B 5/32
                                                                         359/15

(Continued)

OTHER PUBLICATIONS

Oshima et al., "Wide viewing angle three-dimensional display using curved HOE lens array", SPIE—IS&T/ vol. 8648. Retrieved on Feb. 21, 2017. Retrieved from <http://proceedings.spiedigitallibrary.org/>.

(Continued)

*Primary Examiner* — Collin X Beatty
(74) *Attorney, Agent, or Firm* — Treyz Law Group, P.C.; G. Victor Treyz; Kendall W. Abbasi

(57) ABSTRACT

A display may have an array of pixels. Each pixel may have a light-emitting diode such as an organic light-emitting diode or may be formed from other pixel structures such as liquid crystal display pixel structures. The pixels may emit light such as red, green, and blue light. An angle-of-view adjustment layer may overlap the array of pixels. During operation, light from the pixels passes through the angle-of-view adjustment layer to a user. The viewing angle for the user is enhanced as the angular spread of the emitted light from the pixels is enhanced by the angle-of-view adjustment layer. The angle-of-view adjustment layer may be formed from holographic structures recorded by applying laser beams to a photosensitive layer or may be formed from a metasurface that is created by patterning nanostructures on the display using printing, photolithography, or other patterning techniques.

20 Claims, 14 Drawing Sheets

(51) Int. Cl.
- *G02F 1/1335* (2006.01)
- *G02F 1/1343* (2006.01)
- *G03H 1/02* (2006.01)
- *G02B 5/32* (2006.01)
- *G03H 1/00* (2006.01)
- *F21Y 113/13* (2016.01)

(52) U.S. Cl.
CPC ..... *G02F 1/134309* (2013.01); *G03H 1/0005* (2013.01); *G03H 1/0244* (2013.01); *H01L 27/3246* (2013.01); *H01L 51/5262* (2013.01); *H01L 51/5265* (2013.01); *H01L 51/5275* (2013.01); *F21Y 2113/13* (2016.08); *G02F 2001/133507* (2013.01); *G02F 2001/133562* (2013.01); *G02F 2001/134345* (2013.01); *G02F 2202/36* (2013.01); *G03H 2001/0088* (2013.01); *G03H 2001/0212* (2013.01); *G03H 2001/0216* (2013.01); *H01L 27/3234* (2013.01); *H01L 51/5284* (2013.01); *H01L 2227/32* (2013.01)

(58) Field of Classification Search
CPC ............ H01L 51/5275; H01L 51/5284; H01L 2227/32; G02B 5/32; G02F 1/133504; G02F 1/134309; G02F 2001/133507; G02F 2001/134345; G03H 1/0005; G03H 1/0244; G03H 2001/0088; G03H 2001/0212; G03H 2001/0216; F21Y 2113/13
USPC ..................................................... 359/1–20
See application file for complete search history.

(56) References Cited

U.S. PATENT DOCUMENTS

| | | | | |
|---|---|---|---|---|
| 5,745,266 A * | 4/1998 | Smith | ...................... | B60Q 1/30 359/34 |
| 5,966,223 A * | 10/1999 | Friesem | ................ | G02B 5/188 359/16 |
| 6,115,152 A * | 9/2000 | Popovich | ................ | G02B 5/32 353/30 |
| 6,151,142 A * | 11/2000 | Phillips | ................ | G02B 6/0033 359/1 |
| 6,580,529 B1 * | 6/2003 | Amitai | ..................... | G02B 5/32 359/13 |
| 7,139,109 B2 * | 11/2006 | Mukawa | .................. | G02B 5/32 359/22 |
| 7,206,107 B2 * | 4/2007 | Levola | ............... | G02B 27/0081 359/15 |
| 7,503,656 B2 | 3/2009 | Monch | | |
| 7,792,003 B2 * | 9/2010 | Volodin | ................ | G02B 5/203 369/103 |
| 8,233,204 B1 * | 7/2012 | Robbins | ............... | G02B 5/1828 345/7 |
| 8,320,032 B2 * | 11/2012 | Levola | ................ | G02B 5/1814 359/13 |
| 8,619,363 B1 * | 12/2013 | Coleman | ............. | G02B 5/0242 359/576 |
| 8,913,216 B2 * | 12/2014 | Choe | .................... | G02B 5/0242 349/106 |
| 8,965,152 B2 * | 2/2015 | Simmonds | ........... | G02B 6/0035 385/27 |
| 10,145,533 B2 * | 12/2018 | Popovich | ................. | G02B 5/32 |
| 10,254,542 B2 * | 4/2019 | Kollin | ............... | G02B 27/0103 |
| 2003/0067685 A1 * | 4/2003 | Niv | .......................... | G02B 5/32 359/566 |
| 2004/0032659 A1 * | 2/2004 | Drinkwater | ........... | F21V 33/006 359/558 |
| 2005/0141066 A1 * | 6/2005 | Ouchi | ..................... | G02B 5/32 359/15 |
| 2006/0077551 A1 * | 4/2006 | Mitsuya | ............... | G11B 7/0065 359/565 |
| 2009/0128911 A1 * | 5/2009 | Itzkovitch | ........... | G02B 5/1866 359/575 |
| 2009/0141324 A1 * | 6/2009 | Mukawa | ............. | G02B 5/1814 359/13 |
| 2010/0039796 A1 * | 2/2010 | Mukawa | .................. | G02B 5/18 362/97.1 |
| 2012/0092735 A1 * | 4/2012 | Futterer | .................... | G02B 5/32 359/11 |
| 2013/0170004 A1 * | 7/2013 | Futterer | ............... | G02B 6/0046 359/9 |
| 2014/0016051 A1 * | 1/2014 | Kroll | .................... | H04N 13/366 349/15 |
| 2014/0104665 A1 * | 4/2014 | Popovich | ........... | G02B 27/0176 359/15 |
| 2014/0126029 A1 * | 5/2014 | Fuetterer | .............. | G02B 5/1857 359/3 |
| 2014/0140654 A1 * | 5/2014 | Brown | ...................... | G02F 1/29 385/10 |
| 2016/0041323 A1 * | 2/2016 | Ma | ........................ | G03H 1/0465 359/15 |
| 2016/0291328 A1 | 10/2016 | Popovich et al. | | |
| 2017/0235188 A1 * | 8/2017 | Large | .................. | G02F 1/13342 349/68 |
| 2018/0323242 A1 * | 11/2018 | Drzaic | ................. | G03H 1/0244 |
| 2019/0072767 A1 * | 3/2019 | Vallius | ................ | G02B 27/0172 |
| 2019/0086674 A1 * | 3/2019 | Sinay | ................ | G02B 27/0172 |
| 2019/0094803 A1 * | 3/2019 | Futterer | ............... | G03H 1/0402 |

OTHER PUBLICATIONS

Hideya Takahashi et al., "Holographic lens array increases the viewing angle of 3D displays", SPIE (2016) vol. 10.1117/2.1200605.0204.

Qi et al., "Holographically Formed Polymer Dispersed Liquid Crystal Displays", Displays 25.5 (2004): 177-186.

Ermold et al., "Viewing-Angle Enhancement in Holographic Reflective Displays by Nanoscale Holographic Patterning", Journal of the Society for Information Display 13.9, 2005, p. 787-792.

Sagan et al., "Electrically Switchable Bragg Grating Technology for Projection Displays", Proceedings of SPIE, Projection Displays VII, vol. 4294. International Society for Optics and Photonics, 2001. doi: 10.1117/12.420788.

* cited by examiner

DISPLAY WITH HOLOGRAPHIC ANGLE-OF-VIEW ADJUSTMENT STRUCTURES

This application claims the benefit of provisional patent application No. 62/501,582, filed on May 4, 2017, which is hereby incorporated by reference herein in its entirety.

BACKGROUND

This relates generally to electronic devices, and, more particularly, to electronic devices with displays.

Electronic devices often include displays. Displays have arrays of pixels for presenting images to a user if care is not taken, however, a display for an electronic device may not have desired properties. For example, color gamut may be low, images may not be visible over a sufficiently wide angle of view, cost may be too high, or display components may be difficult to manufacture.

SUMMARY

A display may have an array of pixels. Each pixel may have a light-emitting diode such as an organic light-emitting diode or may be formed from other pixel structures such as liquid crystal display pixel structures.

The pixels in the pixel array may emit light such as red, green, and blue light. An angle-of-view adjustment layer may overlap the array of pixels. During operation, light from the pixels passes through the angle-of-view adjustment layer to a user. The viewing angle of the user is enhanced as image light from the pixel array passes through the angle-of-view adjustment layer. This is accomplished by increasing the angular spread of the emitted light from the pixels as the emitted light from the pixels passes through the angle-of-view adjustment layer.

The angle-of-view adjustment layer may be formed from holographic structures. The holographic structures may be created using photosensitive materials. For example, an angle-of-view adjustment layer may be formed from holographic structures recorded by applying laser beams to a photosensitive layer or a stack of photosensitive layers.

If desired, an angle-of-view adjustment layer may be formed from a metasurface that is created by patterning nanostructures on the display. The nanostructures can be formed using printing, photolithography, or other patterning techniques. Metal oxides such as titanium oxide and other materials may be used in forming the nanostructures.

Further features will be more apparent from the accompanying drawings and the following detailed description.

DETAILED DESCRIPTION

Figure 1:
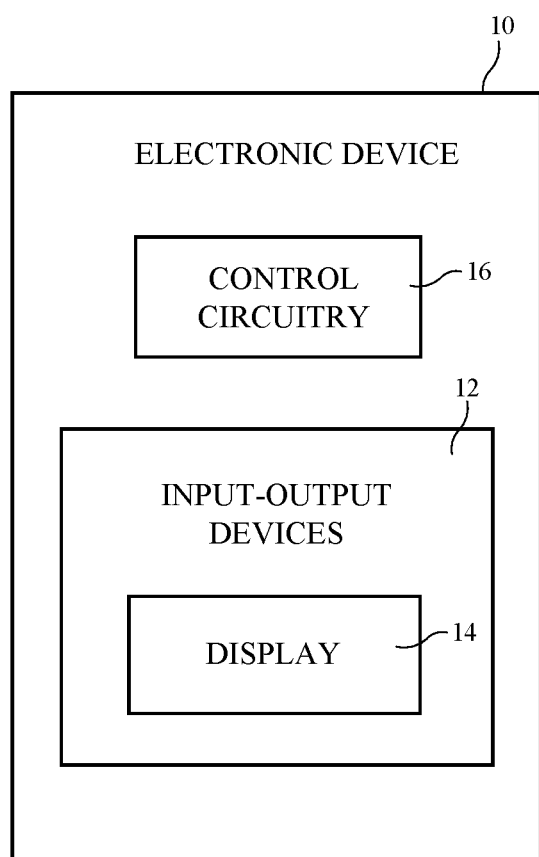
FIG. 1 is a schematic diagram of an illustrative electronic device having a display in accordance with an embodiment.

An illustrative electronic device of the type that may be provided with a display is shown in FIG. 1. As shown in FIG. 1, electronic device 10 may have control circuitry 16. Control circuitry 16 may include storage and processing circuitry for supporting the operation of device 10. The storage and processing circuitry may include storage such as hard disk drive storage, nonvolatile memory (e.g., flash memory or other electrically-programmable-read-only memory configured to form a solid state drive), volatile memory (e.g., static or dynamic random-access-memory), etc. Processing circuitry in control circuitry 16 may be used to control the operation of device 10. The processing circuitry may be based on one or more microprocessors, microcontrollers, digital signal processors, baseband processors, power management units, audio chips, application specific integrated circuits, etc.

Input-output circuitry in device 10 such as input-output devices 12 may be used to allow data to be supplied to device 10 and to allow data to be provided from device 10 to external devices. Input-output devices 12 may include buttons, joysticks, scrolling wheels, touch pads, key pads, keyboards, microphones, speakers, tone generators, vibrators, cameras, sensors, light-emitting diodes and other status indicators, data ports, and other electrical components. A user can control the operation of device 10 by supplying commands through input-output devices 12 and may receive status information and other output from device 10 using the output resources of input-output devices 12. Input-output devices 12 may also be used in gathering information about the environment surrounding device 10. For example, sensors in devices 12 may make ambient light measurements, may make optical proximity measurements to determine whether an external object is in proximity to device 10, may make optical fingerprint measurements, may gather images (e.g., for facial recognition, iris scanning, or other biometric authentication), and/or may make other sensor measurements.

Input-output devices 12 may include one or more displays such as display 14. Display 14 may be a touch screen display that includes a touch sensor for gathering touch input from a user or display 14 may be insensitive to touch. A touch sensor for display 14 may be based on an array of capacitive touch sensor electrodes, acoustic touch sensor structures, resistive touch components, force-based touch sensor structures, a light-based touch sensor, or other suitable touch sensor arrangements.

Control circuitry 16 may be used to run software on device 10 such as operating system code and applications. During operation of device 10, the software running on control circuitry 16 may display images on display 14 using an array of pixels in display 14.

Device 10 may be a tablet computer, laptop computer, a desktop computer, a display, a cellular telephone, a media player, a wristwatch device or other wearable electronic equipment, or other suitable electronic device.

Display 14 may be an organic light-emitting diode display, may be a display based on an array of crystalline light-emitting diode dies (sometimes referred to as micro-LEDs), may be a liquid crystal display, or may be a display based on other types of display technology.

Display 14 may have a rectangular shape (i.e., display 14 may have a rectangular footprint and a rectangular peripheral edge that runs around the rectangular footprint) or may have other suitable shapes. Display 14 may be planar or may have a curved profile.

Figure 2:
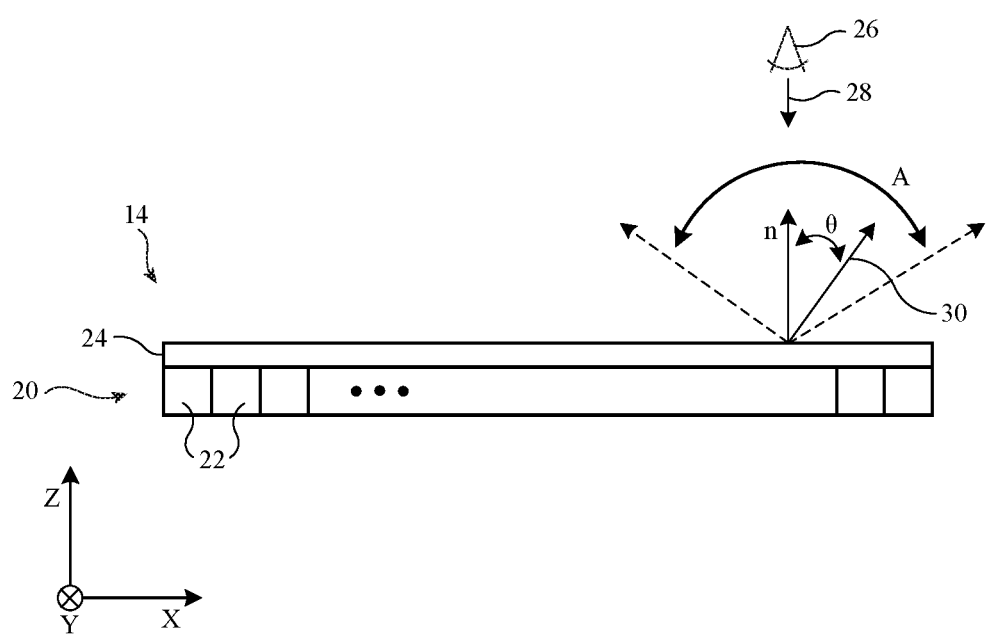
FIG. 2 is side view of an illustrative display in accordance with an embodiment.

A side view of display 14 is shown in FIG. 2. As shown in FIG. 2, display 14 may have a pixel array such as pixel array 20. Pixel array 20 may include rows and columns of pixels 22. Pixel array 20 may emit image light for viewing by viewer 26 in direction 28. Rays of emitted image light such as illustrative ray 30 of 2 may be characterized by an angle θ with respect to surface normal n of display 14. The range of angles over which light rays 30 are emitted by pixels 22 affects the angle of view (A) of display 14. If the angle of view is too narrow, off-angle viewing performance will not be satisfactory.

Due to the construction of pixels 22, light from pixels 22 may initially have a narrow angular spread. To help spread emitted light over a desired range of angles and thereby achieve a desired angle-of-view A for display 14, display 14 may include angle-of-view adjustment layer 24. Layer 24 may be formed from a hologram, a metasurface formed from patterned nanostructures, or other suitable light-spreading layer.

Figure 3:
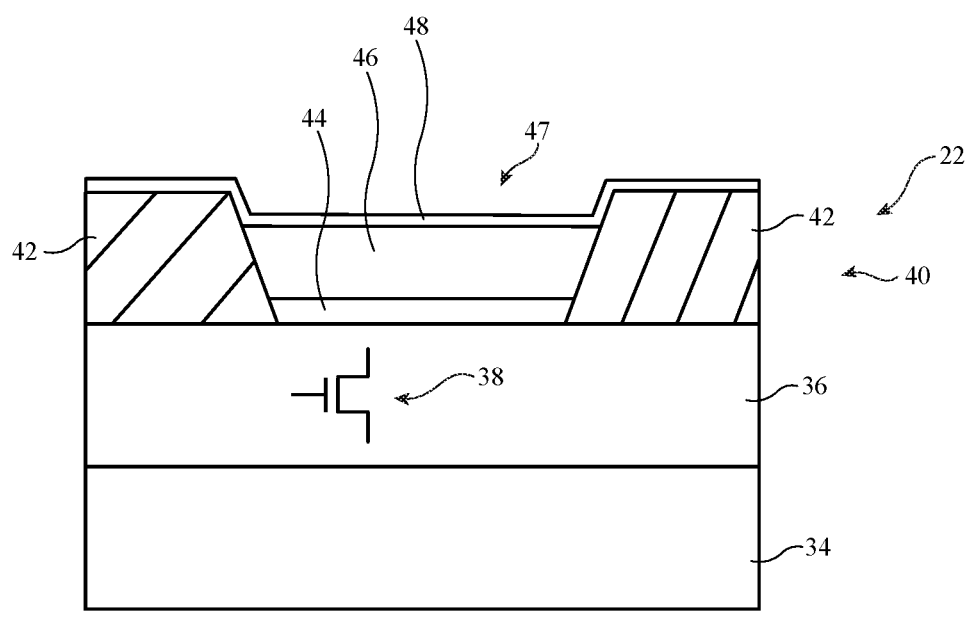
FIG. 3 is a cross-sectional side view of a portion of an illustrative organic light-emitting diode display in accordance with an embodiment.
Figure 3:
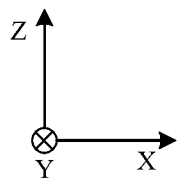

Display 14 may be formed from organic light-emitting diodes, packaged light-emitting diodes, micro-light-emitting diodes, liquid crystal display structures, microdisplays, or other suitable display structures. FIG. 3 is a cross-sectional side view of an illustrative pixel 22 in a light-emitting diode display such as an organic light-emitting diode display. As shown in FIG. 3, pixel 22 may be formed on a substrate such as substrate 34 (e.g., glass, ceramic, plastic, etc.). Thin-film circuitry such as thin-film transistor circuitry 36 may be formed on substrate 34. Circuitry 36 may include transistors such as thin-film transistor 38 for forming pixel circuits for pixels such a pixel 22. Each pixel circuit may be provided with a respective data value and may supply a respective light-emitting diode such as light-emitting diode 47 with a corresponding drive current (e.g., transistor 38 may be coupled to diode 47 to provide current to diode 47). This causes organic light-emitting diode 47 to emit light of an intensity that is proportional to the drive current.

Diode 47 may have electrodes such as anode 44 and cathode 48. Organic layers 46 (e.g., hole and electron transport and injection layers, a layer of organic emissive material, etc.) may be interposed between electrodes 44 and 48. Electrode 44 may be formed from metal (e.g., a layer of Ag, Al, or other suitable metals), a metal layer formed from alloys of suitable metals, conductive metal oxides (such as indium tin oxide), or combinations of these materials. Electrode 48 may be formed from a semitransparent metal layer (e.g., Al, Mg, or other suitable metal), or suitable metal oxides, or combinations of these materials. With this type of arrangement, organic light-emitting diode 47 may be a resonant cavity organic light-emitting diode. The resonant cavity may be strong, moderate, or weak, depending on the desired spectral and angular output of the device.

Resonant cavity organic light-emitting diodes may exhibit relatively narrow linewidths (e.g., spectral widths of 10-30 nm full-width-half-maximum or other suitable bandwidths) and relatively high efficiencies. Resonant cavity organic light-emitting diodes may also exhibit relatively directional light output characteristics. For this reason, the native light output from diode 47 may have an angular spread that is narrower than desired for display 14. Angle-of-view adjustment layer 24 (FIG. 2) may be used to widen the angular range of the light output from pixels such as the resonant organic light-emitting diode pixel of FIG. 3, thereby providing display 14 with a desired angle of view while retaining desirable characteristics for diodes 47 such as the ability to produce pure colors and high efficiency. If desired, light-emitting diodes for display 14 may be micro-LEDs formed from individual crystalline semiconductor dies. The arrangement of FIG. 3 in which diode 47 is an organic light-emitting diode is merely illustrative.

Figure 4:
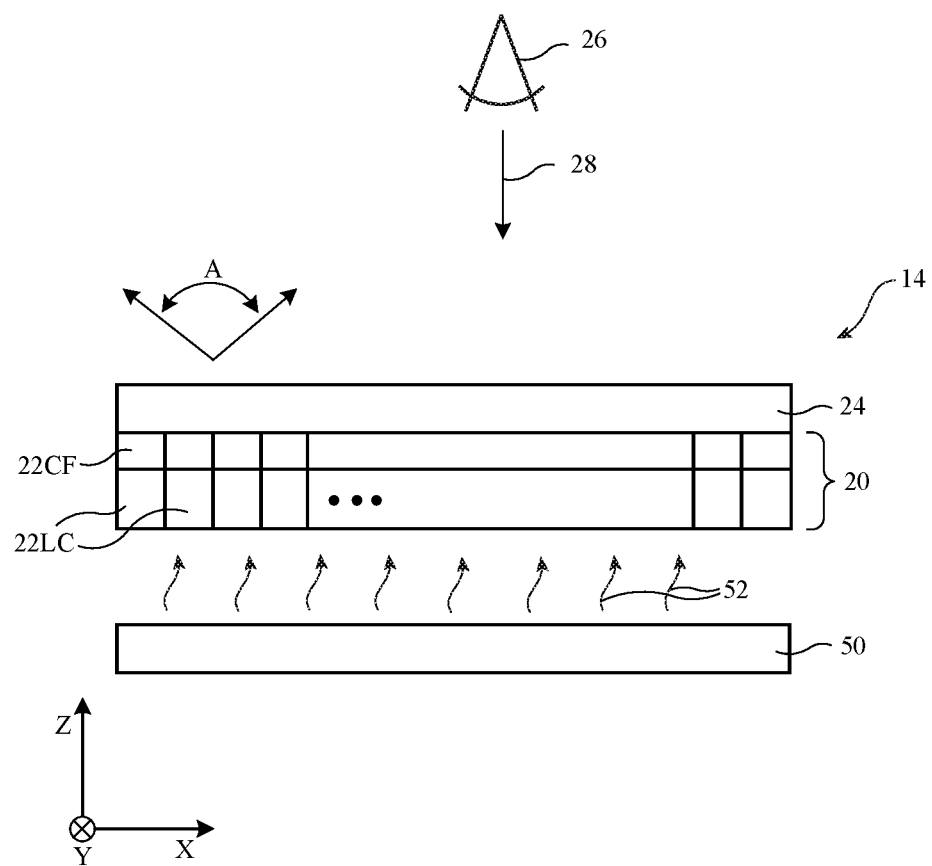
FIG. 4 is a cross-sectional side view of a display such as a liquid crystal display in accordance with an embodiment.

FIG. 4 shows how display 14 may be a liquid crystal display. As shown in FIG. 4, backlight unit 50 may produce backlight illumination 52. Backlight illumination 52 may, as an example, be collimated light with a relatively low angular spread. Liquid crystal display 14 may have a pixel array such as pixel array 20. Pixel array 20 may include pixels 22LC each of which is controlled by a corresponding pixel circuit (e.g., a thin-film transistor pixel circuit on a thin-film transistor layer having thin-film transistor circuitry on a transparent substrate). The pixel circuit applies an adjustable electric field to a pixel-sized portion of a liquid crystal layer. An array of color filters 22CF and polarizer structures upper and lower polarizers) may be incorporated into liquid crystal display 14.

In configurations in which backlight unit 50 produces backlight illumination 52 with a narrow angle of view, display switching speed and other display operating characteristics can be optimized. This may, however, result in emitted light that has a relatively narrow angular spread. To ensure that the angle-of-view of display 14 is satisfactory, angle-of-view adjustment layer 24 may overlap pixel array 20.

With one illustrative configuration, angle-of-view adjustment layer 24 may be formed from a holographic layer. The holographic layer may, for example, be a volume hologram (e.g., Bragg gratings) formed by exposing photosensitive material to interfering reference and signal beams of laser light. The photosensitive material may be a photorefractive film that exhibits a change in refractive index in proportional to the intensity of the laser light to which it is exposed. The film may be exposed and then processed (e.g., by application of heat and/or chemicals) to fix the index-of-refraction changes produced by the laser light.

Figure 5:
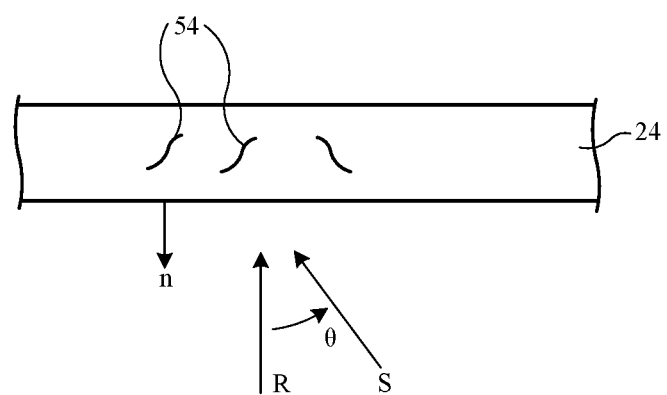
FIG. 5 is a side view of a holographic layer in accordance with an embodiment.

An illustrative photosensitive layer that is being exposed to a reference beam R and a signal beam S to create angle-of-view adjustment layer 24 is shown in FIG. 5. As shown in FIG. 5, reference beam R may be directed at layer 24 with a first orientation and signal beam S may be directed at layer 24 with a second orientation that is different than the first orientation. As an example, reference beam R may be a plane wave beam that is directed at layer 24 parallel to surface normal n of layer 24 (e.g., in alignment with a future "playback" beam of light emitted by a pixel 22). Signal beam S may be a plane wave beam or a beam with an angular spread (e.g., the beam may be a non-plane-wave beam having an angular spread associated with a desired angle-of-view) and may be oriented at an angle θ with respect to surface normal n. Due to fluctuations in light intensity from interfering R and S beams, patterns of index-of-refraction increases (e.g., holographic structures 54 such as Bragg gratings) are produced in the material of layer 24.

If desired, holographic recording parameters may be varied during the formation of layer 24, so that desired light spreading structures are created in layer 24. Parameters that may be varied include the angular spread of the recording light beams (e.g., whether the reference and/or signal beams are collimated plane waves or are diverging), the wavelength of light of the recording beams, and the angle of orientation of the recording light beams. As an example, the holographic structures of layer 24 may be recorded using a plane wave for reference beam R and a plane wave for signal beam S while stepping the angular orientation θ of signal beam S through each of multiple different angular orientations corresponding to the desired orientations of diffracted light rays to be produced when light from pixel 22 is played back through layer 24. Any suitable number of different angular orientations θ may be used for signal beam S (e.g., 1-100, 3-20, at least 5, at least 10, fewer than 200, etc.).

As another example, reference beam R may be a plane wave and signal beam S may have an angular spread equal to the desired angular spread for light passing through layer 22 during operation (e.g., 20-30°, at least 15°, less than 35°, etc.).

The wavelength of the reference and signal beams may match the wavelengths of anticipated light from pixels 22. If, for example, the emitted light from pixels 22 includes red, green, and blue light from respective red, green, and blue pixels, then the wavelengths of the reference and signal beams may respectively be stepped through red, green, and blue wavelengths to form respective red holographic structures, green holographic structures, and blue holographic structures (in separate layers that overlap or in a common layer). The red holographic structures may be configured to redirect red light emitted from red pixels (e.g., red resonant cavity organic light-emitting diodes or other red pixels) without redirecting the emitted green light and without redirecting the emitted blue light and cover the red pixels, green pixels, and blue pixels. The green holographic structures may be configured to redirect green light emitted from green pixels without redirecting the emitted red light and without redirecting the emitted red light and cover the red pixels, green pixels, and blue pixels. The blue holographic structures may be configured to redirect blue light emitted from blue pixels without redirecting the emitted green light and without redirecting the emitted green light and cover the red pixels, green pixels, and blue pixels.

To accommodate the finite linewidths of pixels 22, the recording laser beams may be stepped through multiple wavelengths within the linewidth of each pixel color. For example, the signal and reference beams may be adjusted to performing holographic recording at 1-100 different wavelengths, 3-20 wavelengths, at least 5 wavelengths, or fewer than 50 wavelengths, each of which corresponds to a wavelength within the linewidth of a given pixel color. As an example, 3-20 different red wavelengths may be used during holographic recording, each of which lies within the 10-30 nm linewidth of a light-emitting diode pixel in array 20. Green and blue holographic structures may likewise be recorded using respectively multiple green wavelengths and multiple blue wavelengths.

In general, any suitable combination of angular orientation θ, angular spread, and wavelength may be used during recording of the holographic structures in layer 24. By varying parameters such as these, the diffraction characteristic (light redirecting characteristic) of layer 24 can be configured to increase the angular spread of emitted light from pixels 22 to a desired value.

Figure 6:
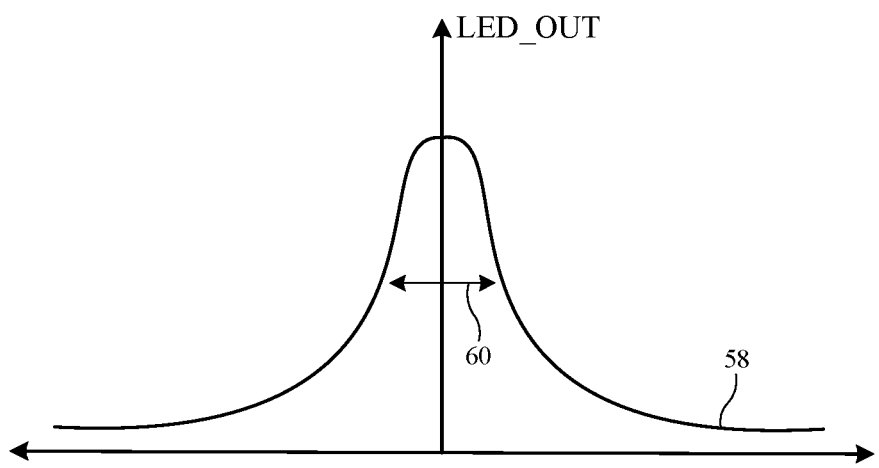
FIGS. 6 and 7 are graphs showing how a holographic layer may be used in adjusting the angle of view of emitted light from a pixel array in a display in accordance with an embodiment.
Figure 7:
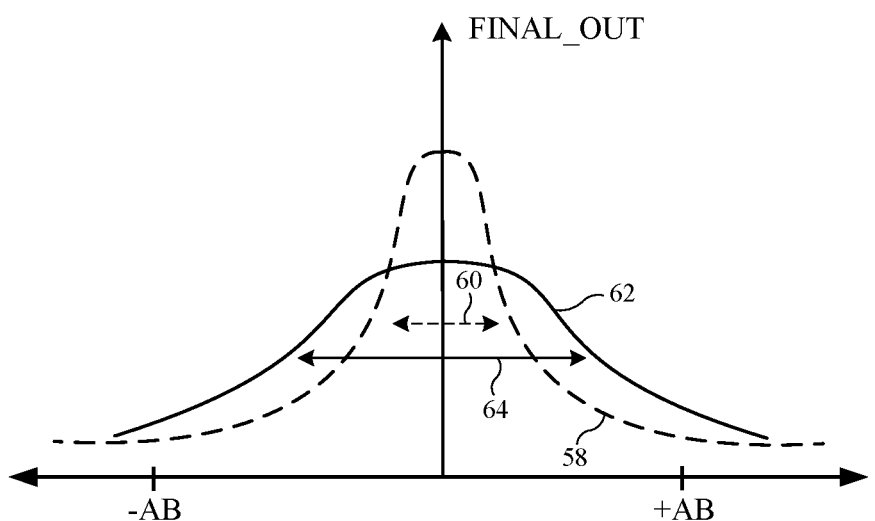

Consider, as an example, the scenarios of FIGS. 6 and 7. In this example, a given pixel 22 is emitting light (e.g., red light, green light, or blue light) with an intensity-versus-angle profile such as profile 58 of FIG. 6. After passing through layer 24, this light may have an intensity-versus-angle profile such as profile 62 of FIG. 7. As shown in FIGS. 6 and 7, the width (e.g., the full-width-half-maximum width) of curve 58 (width 60) is smaller than the width of curve 62 (width 64), indicating that layer 24 has increased the angular spread of emitted light (e.g., to a desired angular spread associated with a viewing angle A of desired size such as 40-80°, at least 50°, less than 90°, or other suitable viewing angle). Moreover, as shown in FIG. 7, the widening of the angular distribution of the light intensity of the emitted light after passing through layer 24 takes place mostly or entirely at lower angles (e.g., on-axis light angles of between −AB and +AB). Far-off-axis light is not affected by layer 24 (e.g., light rays with angles greater in magnitude than angle AB are not disturbed and pass unaffected through layer 24). As a result, overly concentrated on-axis light (e.g., light within the FWHM angles associated with intensity profile LED OUT of FIG. 6) is spread outwardly to help create a satisfactory broadened angular distribution of image light without unnecessarily decreasing light intensities for rays of light that are already at wide angles (e.g., angles greater than angle AB). The spreading out and weakening of far-off-axis light is prevented. Satisfactory wide-angle visibility for images on display 14 is therefore maintained even when angle-of-view-adjustment layer 24 is incorporated into display 14. The value of angle AB may be, for example, in the range of 40-65°, 30-85°, or other suitable value.

With one illustrative arrangement, the holographic recording process of FIG. 5 may be performed globally on layer 24, so that each area of the photosensitive film is recorded evenly and so that the holographic structures spread uniformly across all of display 14 and cover all pixels 22 in pixel array 20 without creating any individual holographic elements (e.g., without creating an array of individual pixel-sized holographic elements). With this type of arrangement, there is no need to laterally align layer 24 to the pixels 22 of array 20. Layer 24 need only overlap pixel array 20 in display 14. With another illustrative arrangement, holographic structures (e.g., red holographic structures for red pixels, green holographic structures for green pixels, and blue holographic structures for blue pixels) may be formed in pixel-sized regions on layer 24 and layer 24 may be aligned at the pixel level with pixels 22 (e.g., so that red holographic structures are aligned with red pixels, etc.).

Figure 8:
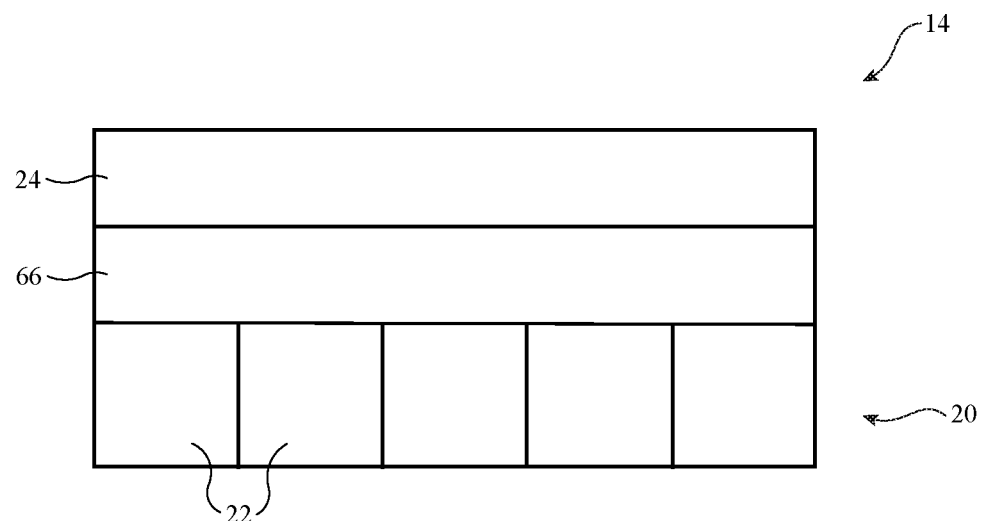
FIGS. 8 and 9 are cross-sectional side views of illustrative displays in accordance with embodiments.
Figure 9:
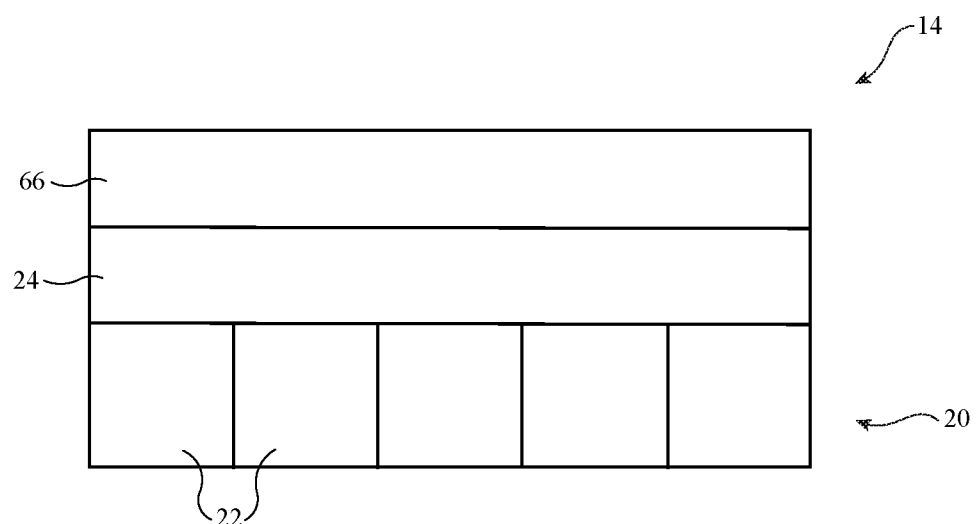

FIG. 8 is a cross-sectional side view of display 14 showing how layer 24 may be placed on top of a polarizer layer such as circular polarizer 66, so that polarizer 66 is interposed between layer 24 and pixel array 20. Circular polarizer 66 may be used, for example, to help suppress ambient light reflections from structures in pixel array 22. FIG. 9 is a cross-sectional side view of display 14 in an illustrative configuration in which polarizer 66 (e.g., a circular polarizer) has been placed on top of layer 24, so that layer 24 is interposed between polarizer 66 and pixel array 20. The hologram for layer 24 may be configured in accordance with the location of layer 24 in display 14.

Figure 10:
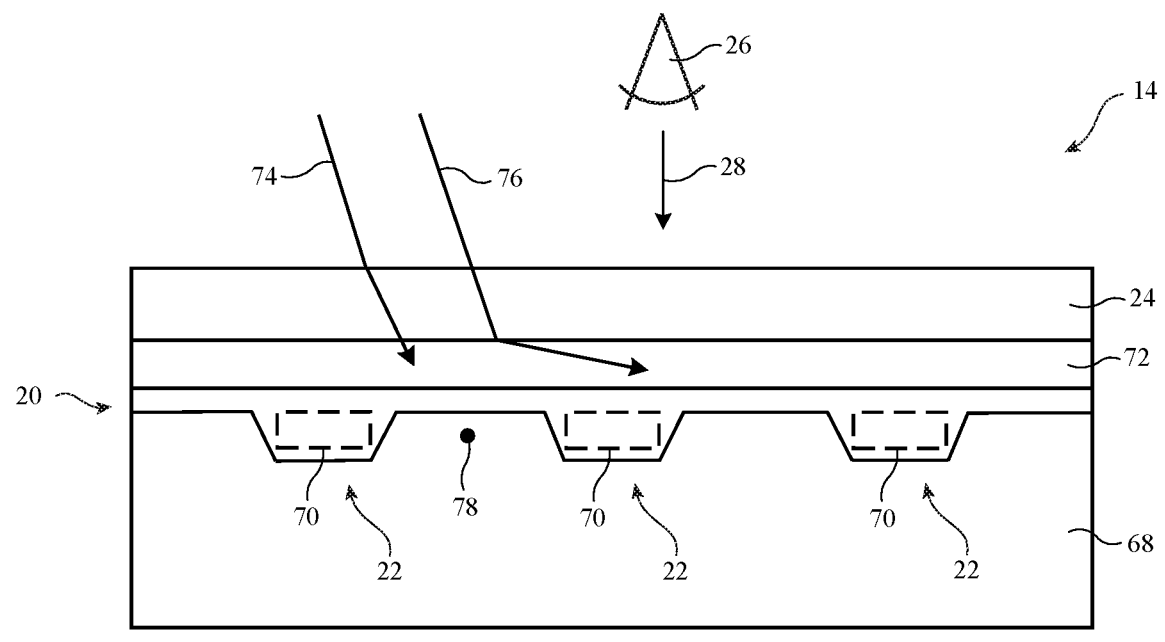
FIG. 10 is a cross-sectional side view of a display with suppressed ambient light reflections in accordance with an embodiment.

In the illustrative configuration for display 14 that is shown in FIG. 10, pixel array 20 is formed from an array of pixels 22 in layer 68 (e.g., a layer containing a substrate, thin-film transistor circuitry, light-emitting diode structures, etc.). Pixels 22 may contain light-emitting diodes 70 (e.g., organic light-emitting diodes or microLEDs). Layer 72 may be formed from a clear polymer or other material that is transparent to visible light. Ambient light rays such as ray 74 may pass through layer 24 and layer 72 and be absorbed in locations such as location 78 (e.g., in opaque materials in the upper portions of layer 68). Ambient light rays such as ray 76 may be guided within layer 72 and thereby prevented from reflected towards viewer 26.

If desired, holographic structures may be used in directing light into and out of light-based components. Consider, as an example, the cross-sectional side view of display 14 of FIG. 11. In this example, device 10 has a display with an array of pixels 22 such as pixel array 20. Pixel array 20 is formed in layer 68 (e.g., a substrate layer, thin-film transistor circuitry, etc.). Holographic structures 54A and 54B are formed in portions of layer 24. Layer 24 may also include holographic structures that serve as angle-of-view adjustment structures to help enhance the angular spread of light emitted from pixels 22.

Light-based component 80 may be overlapped by holographic structures such as structure 54A. Component 80 may include components such as light-emitting diodes, lasers, and other light sources and may include light detectors (e.g., photodiodes, etc.).

Figure 11:
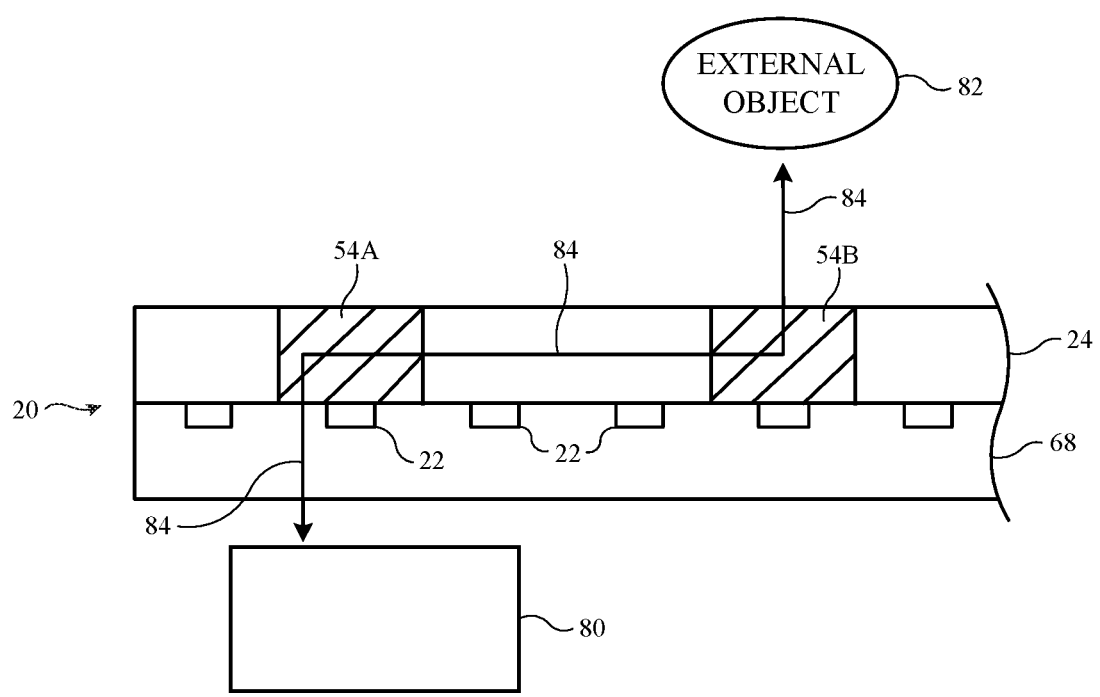
FIG. 11 is a cross-sectional side view of an illustrative display with a holographic layer being used to redirect light associated with a light-based component in accordance with an embodiment.

Consider, as an example, a scenario in which component 80 of FIG. 11 includes both a light-emitting device and a light detecting device that allows component 80 to serve as a light-based proximity detector (e.g., a proximity detector in a cellular telephone that determines when an ear speaker in the telephone is adjacent to a user's ear). Holographic structure MA may overlap the light-emitting device in component 80, which is emitting light 84 outwardly through layer 68. Holographic structure 54A may serve as an input coupler that couples this light 84 from component 80 into layer 24. Layer 24 may then serve as a thin-film waveguide that guides light 84 to holographic structure 54B. Structure 54B may serve as an output coupler that couples the emitted light 84 out of layer 24 towards external object 82. Object 82 (e.g., the body of a user or other external object) may reflect the emitted light back towards structure 54B, which may serve as an input coupler that couples light into the waveguide formed from layer 24. After being guided to structure 54A, which serves as an output coupler, the reflected light is directed towards the light detector in component 80. The emitted and reflected light in this scenario may be, for example, infrared light. If desired, this type of arrangement may be used for any suitable light-based component (e.g., an ambient light sensor, status indicator light, image sensor, etc.). The use of holographic structures and waveguide techniques to redirect and guide light for component 80 may facilitate the incorporation of component 80 within the housing of device 10.

If desired, angle-of-view adjustment structure 24 may be implemented using nanostructures that are imprinted or photolithographically formed on a substrate. These nanostructures may, for example, have feature sizes less than a wavelength of light and may form a metasurface that serves as an angle-of-view adjustment layer for display 14.

Figure 12:
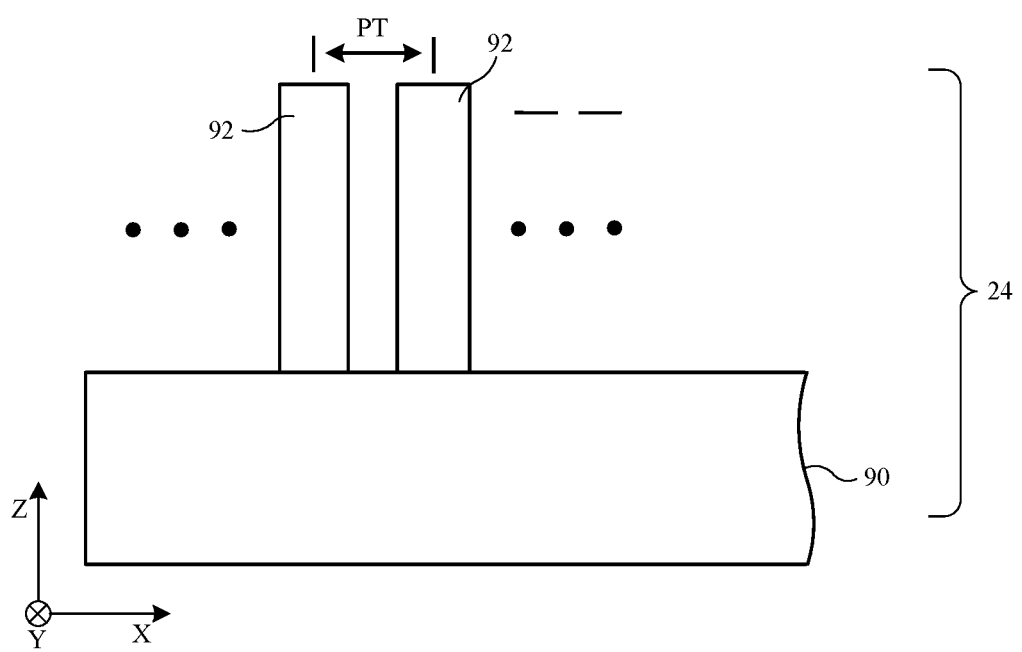
FIG. 12 is a cross-sectional side view of an illustrative metasurface formed from a layer of nanostructures such as nanopillars of transparent material in accordance with an embodiment.
Figure 13:
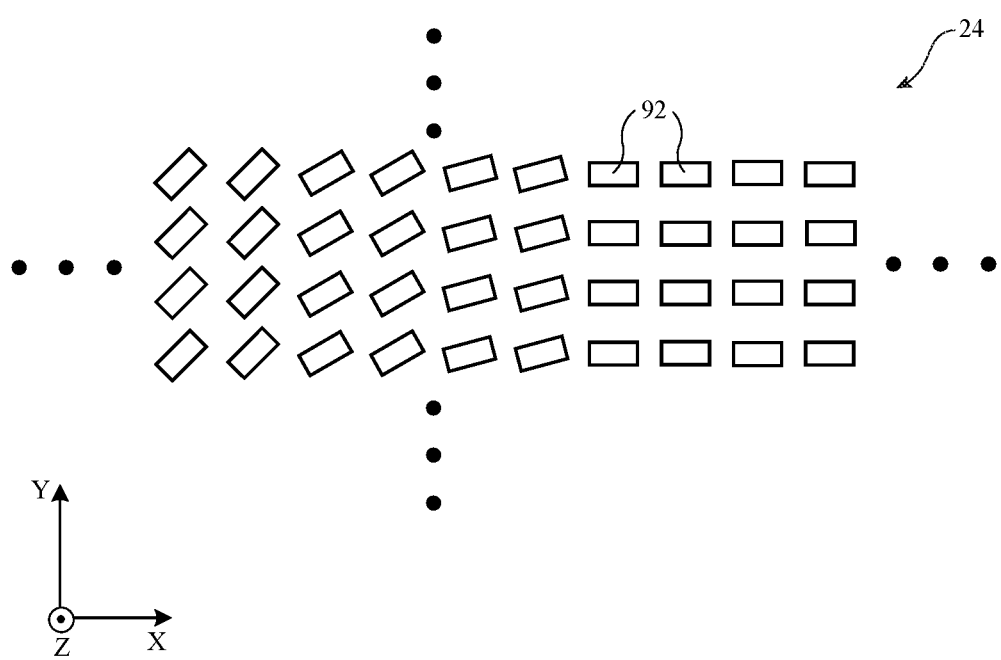
FIG. 13 is a top view of an illustrative metasurface in accordance with an embodiment.

Consider, as an example, the arrangement of FIG. 12. As shown in FIG. 12, layer 24 has a substrate such as substrate 90. Substrate 90 may be formed from a clear layer of material (e.g., glass, polymer, ceramic, etc.). A layer of nanostructures 92 may be formed on substrate 90 by nanoprinting (e.g., using a titanium dioxide sol-gel slurry followed by a thermal cure) or photolithography (as examples) and may form a metasurface that allows layer 24 to serve as an angle-of-view adjustment layer. In the example of FIG. 12, nanostructures 92 are columns of high refractive index material such as a metal oxide (e.g., titanium oxide, zinc oxide, tin oxide, silicon dioxide, etc.) or other transparent non-conductive materials, etc. The column-to-column spacing of structures 92 (pitch PT) may be 0.1-5 microns, at least 0.2 microns, at least 0.5 microns, less than 50 microns, less than 25 microns, or other suitable distance. The lateral dimensions of structures 92 (width and depth in dimensions X and Y, respectively) may be less than visible light wavelengths (e.g., less than 0.5 microns, less than 0.4 microns, less than 0.3 microns, more than 0.1 microns, etc.) or may have other suitable sizes and may be significantly smaller than the lateral dimension of each pixel 22. Pixels 22 may be rectangular, may be chevron shaped, or may have other suitable shapes and may have lateral dimensions of 5-300 microns, at least 10 microns, less than 70 microns, 50-250 microns, or other suitable size. The height of structures 92 in FIG. 12 may be, for example, 0.2-1.2 microns, at least 0.3 microns, less than 1 micron, 0.6 microns, or other suitable size. As light from each pixel 22 passes through the nanosurface formed by structures 92, this light is selectively retarded in phase due to the presence of each of nanostructures 92. Nanostructures 92 may have a pattern such as the illustrative top view pattern of structures 92 of FIG. 13 or other suitable pattern that allows structures 92 to enhance the angular spread of light emitted by pixels 22 and thereby serve as an angle-of-view adjustment layer for display 14.

Figure 14:
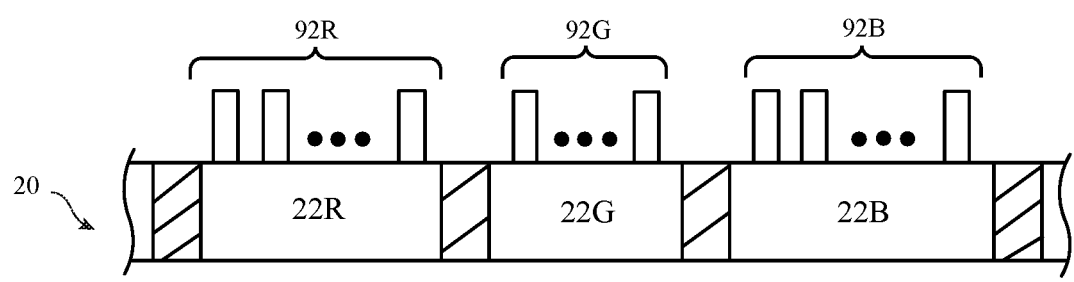
FIG. 14 is a side view of an illustrative display with a metasurface having areas with different light redirecting properties such as color-dependent light redirecting properties aligned with respective pixels in accordance with an embodiment.

The space between nanostructures 92 may be empty (e.g., filled with air) and/or may be filled with other transparent materials. For example, the space between nanostructures 92 may be filled with a transparent material with a low refractive index (such as a silicone polymer, a fluoropolymer, an acrylate polymer, etc.) which can serve as a means of mechanical protection for the nanostructures. The polymer layer can extend higher than nanostructures 92 to afford more protection. The polymer layer can be deposited through solution means, or evaporated. The polymer layer should have a refractive index lower than the nanostructures, FIG. 14 is a side view of display 14 in an illustrative configuration in which nanostructures 92 have been patterned to form a set of red nanostructures (red light nanostructures) 92R configured to spread (redirect) red light from red pixel 22R, a set of green nanostructures (green light nanostructures) 92G configured to spread (redirect) green light from green pixel 22G, and blue nanostructures (blue light nanostructures) 92B that are configured to spread (redirect) blue light from blue pixel 22B. The configuration used for nanostructures 92R (e.g., the sizes and layout pattern of each nanostructure in red nanostructures 92R) may be different than the corresponding sizes and pattern of the green nanostructures 92G. In turn, the green and blue nanostructures 92G and 92B may have different nanostructure sizes and layouts. This allows nanostructures 92R, 92G, and 92B to each be tailored to spread light appropriately for a pixel of a different respective color (e.g., so that the resulting angular spread for red, green, and blue light is identical). This may help to minimize color shifts in images displayed on display 14 as a function of viewing angle.

Arrangements of the type shown in FIG. 14 involve fabricating nanostructures 92 in alignment with pixels 22 either by forming nanostructures 92 directly on pixel array 20 as shown in FIG. 14 or by aligning nanostructures 92 that have been formed on a separate substrate such as substrate 90 of FIG. 12 with pixels 22 in pixel array 20. If desired, alignment requirements may be relaxed by forming layer 24 from alignment-insensitive nanostructures.

As an example, layer 20 may be formed from multiple sets of interspersed nanostructures, where each set of nanostructures is configured to handle light at a different wavelength. These sets of interspersed nanostructures may be spread across all of substrate 90 uniformly and therefore need not be aligned with particular pixels 22 in array 20.

Figure 15:
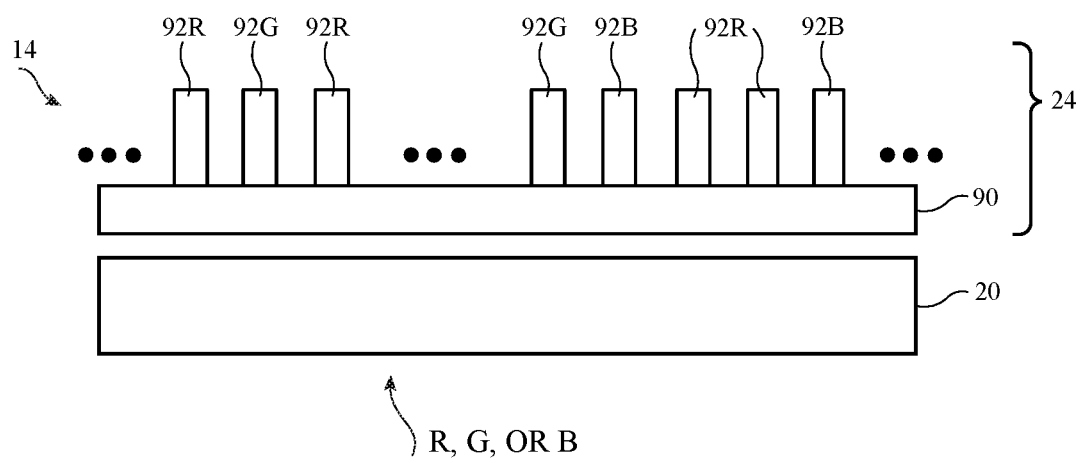
FIG. 15 is a side view of an illustrative display with interleaved nanopillars for different wavelengths so that a uniform metasurface can overlap a pixel array without need to align the particular portions of the metasurface with particular pixels in accordance with an embodiment.

Consider, as an example, layer 24 of FIG. 15. As shown in FIG. 15, the nanostructures on substrate 90 of layer 24 may include three sets of nanostructures (e.g., nanostructures 92R for adjusting the angle of view of red light from red pixels as well as nanostructures 92G and nanostructures 92B for green and blue pixel light, respectively). In this type of arrangement, red nanostructures 92R are configured (by adjusting the distances between each of the red nanostructures 92R and the size and shapes of these nanostructures) to interact with emitted red light from red pixels 22R and to not interact significantly with green or blue light. At the same time, the placement, shapes, and sizes of the green nanostructures 92G are selected so that the set of green nanostructures 92G will interact with green light, but not red and blue light. The set of blue nanostructures 92B that is interspersed with the red and green nanostructures is configured to interact with blue light, but not red and green light. Nanostructures 92R, 92G, and 92B are not patterned in an array pattern to match the pixels of array 20 but rather are distributed uniformly across the surface of substrate 90 and layer 24 so that nanostructures 92R overlap red, green, and blue pixels, nanostructures 92G overlap red, green, and blue pixels, and nanostructures 92B overlap red, green, and blue pixels. So long as layer 24 overlaps array 20, layer 24 will satisfactorily widen the angle of view of the light emitted from pixel array 20 without the need to align particular portions of layer 24 to particular pixels of array 20.

Figure 16:
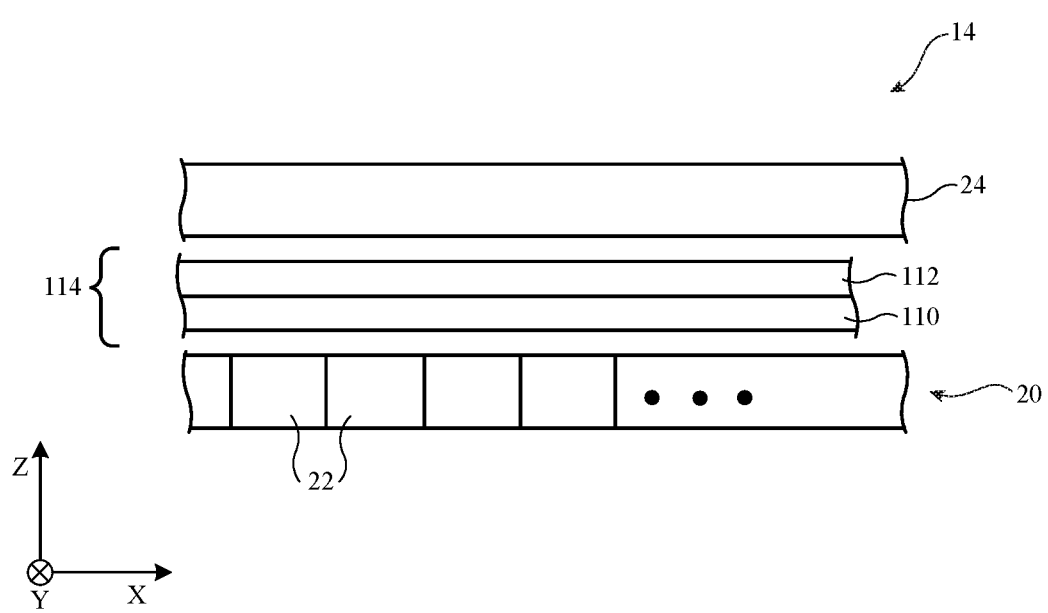
FIG. 16 is a cross-sectional side view of an illustrative display in accordance with an embodiment.

A metasurface angle-of-view adjustment layer such as layer 24 of FIG. 16 may be incorporated into a display with a polarizer. As shown in FIG. 16, for example, display 14 may include circular polarizer 114 formed from linear polarizer 112 and quarter wave plate 110. Polarizer 24 may be placed above or below layer 24 to help suppress ambient light reflections. In the example of FIG. 16, circular polarizer 114 has been interposed between angle-of-view adjustment layer 24 and pixel array 20. Light from pixels 22 such as light-emitting diode pixels is initially unpolarized, but will be linearly polarized after passing through linear polarizer 112. To accommodate the linear polarization of the light that reaches layer 24, nanostructures 92 in layer 24 can be configured for optimal operation with linearly polarized light having a polarization axis aligned with the pass axis of linear polarizer 112.

The foregoing is merely illustrative and various modifications can be made to the described embodiments. The foregoing embodiments may be implemented individually or in any combination.

What is claimed is:

1. A display, comprising:
 a two-dimensional array of pixels that emits light to display images; and
 a holographic angle-of-view adjustment layer without individual holographic elements that overlaps the two-dimensional array of pixels and that includes holographic structures configured to widen an angle-of-view associated with the images by increasing an angular spread of the light from the two-dimensional array of pixels.

2. The display defined in claim 1 wherein the pixels comprise liquid crystal display pixels.

3. The display defined in claim 1 wherein the pixels comprise light-emitting diodes that each emit the light across a first range of angles and wherein the holographic structures increase the angular spread of the light to a second range of angles that is larger than the first range of angles.

4. The display defined in claim 3 wherein the light-emitting diodes include crystalline semiconductor dies.

5. The display defined in claim 3 wherein the light-emitting diodes are resonant cavity organic light-emitting diodes.

6. The display defined in claim 1 wherein each pixel includes at least one thin-film transistor and includes an organic light-emitting diode having a metal layer that forms an anode and a metal layer that forms a cathode.

7. The display defined in claim 6 wherein each organic light-emitting diode is a resonant cavity light-emitting diode.

8. The display defined in claim 7 wherein each resonant cavity light-emitting diode has a full-width-half-maximum spectral width of 10-30 nm.

9. The display defined in claim 8 wherein the holographic structures comprise red light holographic structures configured to redirect red light, green light holographic structures configured to redirect green light, and blue light holographic structures configured to redirect blue light.

10. The display defined in claim 9 wherein the resonant cavity organic light-emitting diodes include red light-emitting diodes configured to emit red light, green light-emitting diodes configured to emit green light, and blue light-emitting diodes configured to emit blue light.

11. The display defined in claim 10 wherein the holographic angle-of-view adjustment layer is a single photosensitive layer that extends across the two-dimensional array of pixels.

12. The display defined in claim 11 wherein the holographic structures of the photosensitive layer comprises holographic structures recorded using a plane wave reference beam and plane wave signal beams at multiple respective angular orientations with respect to the photosensitive layer.

13. The display defined in claim 11 wherein the holographic structures of the photosensitive layer comprise holographic structures recorded using laser beams with different respective wavelengths.

14. The display defined in claim 11 wherein the holographic structures of the photosensitive layer comprise holographic structures recorded using at least one non-plane-wave laser beam.

15. A display, comprising:
 two-dimensional array of pixels configured to display images, wherein each pixel includes a resonant cavity organic light-emitting diode that emits light; and
 an angle-of-view adjustment layer that overlaps the array of pixels and that includes holographic structures configured to widen an angle-of-view associated with the images by increasing an angular spread of the light emitted by each of the resonant cavity organic light-emitting diodes.

16. The display defined in claim 15 wherein the resonant cavity organic light-emitting diodes include red resonant cavity organic light-emitting diodes configured to emit red light, green resonant cavity organic light-emitting diodes configured to emit green light, and blue resonant cavity organic light-emitting diodes configured to emit blue light, wherein the holographic structures include red holographic structures that are configured to redirect red light emitted from the red resonant cavity organic light-emitting diodes without redirecting the emitted green light and without redirecting the emitted blue light and that overlap the red resonant cavity organic light-emitting diodes, the green resonant cavity organic light-emitting diodes, and the blue resonant-cavity light-emitting diodes.

17. The display defined in claim 16 wherein the holographic structures include green holographic structures that are configured to redirect green light emitted from the green resonant cavity organic light-emitting diodes without redirecting the emitted red light and without redirecting the emitted blue light and that overlap the red resonant cavity organic light-emitting diodes, the green resonant cavity organic light-emitting diodes, and the blue resonant-cavity light-emitting diodes.

18. The display defined in claim 17 wherein the holographic structures include blue holographic structures that are configured to redirect blue light emitted from the blue resonant cavity organic light-emitting diodes without redirecting the emitted red light and without redirecting the emitted green light and that overlap the red resonant cavity organic light-emitting diodes, the green resonant cavity organic light-emitting diodes, and the blue resonant-cavity light-emitting diodes.

19. A display, comprising:
a two-dimensional array of pixels configured to display images, wherein the pixels include red resonant cavity organic light-emitting diodes configured to emit red light, green resonant cavity organic light-emitting diodes configured to emit green light, and blue resonant cavity organic light-emitting diodes configured to emit blue light; and
a holographic layer overlapping the array of pixels, wherein the holographic layer includes green holographic structures that are configured to widen an angular spread of the green light emitted from the green resonant cavity organic light-emitting diodes without redirecting the emitted red light and without redirecting the emitted blue light and that cover the red resonant cavity organic light-emitting diodes, the green resonant cavity organic light-emitting diodes, and the blue resonant-cavity light-emitting diodes.

20. The display defined in claim 19 further comprising:
a light-based component that is overlapped by the array of pixels and the holographic layer, wherein the holographic layer has portions that serve as couplers that are configured to couple light into the holographic layer to guide the light in the holographic layer and that are configured to couple light out of the holographic layer, and wherein light associated with the light-based component passes through the portions.

* * * * *